United States Patent
Lo et al.

(10) Patent No.: US 10,626,499 B2
(45) Date of Patent: Apr. 21, 2020

(54) DEPOSITION DEVICE STRUCTURE

(71) Applicant: Taiwan Semiconductor Manufacturing Co., Ltd., Hsinchu (TW)

(72) Inventors: Yen-Chan Lo, Hsinchu (TW); Huan-Chieh Chen, Taichung (TW); Yi-Fang Lai, Zhubei (TW); Keith Kuang-Kuo Koai, Zhubei (TW); Chin-Feng Sun, Zhubei (TW); Po-Hsiung Leu, Taoyuan (TW); Ding-I Liu, Hsinchu (TW); Kai-Shiung Hsu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 262 days.

(21) Appl. No.: 15/725,573

(22) Filed: Oct. 5, 2017

(65) Prior Publication Data
US 2019/0032215 A1    Jan. 31, 2019

Related U.S. Application Data

(60) Provisional application No. 62/537,990, filed on Jul. 28, 2017.

(51) Int. Cl.
| C23C 16/40 | (2006.01) |
| C23C 16/455 | (2006.01) |
| C23C 16/46 | (2006.01) |

(52) U.S. Cl.
CPC .... C23C 16/45565 (2013.01); C23C 16/4557 (2013.01); C23C 16/46 (2013.01)

(58) Field of Classification Search
CPC .............. C23C 16/45565; C23C 16/46; C23C 16/4557
USPC .............. 118/715; 156/345.33, 345.34
See application file for complete search history.

(56) References Cited

U.S. PATENT DOCUMENTS

| 2007/0119371 A1* | 5/2007 | Ma | C23C 16/18 118/723 E |
| 2008/0241379 A1* | 10/2008 | Suzuki | C23C 16/16 427/255.15 |
| 2011/0092072 A1* | 4/2011 | Singh | C23C 14/541 438/710 |
| 2013/0164948 A1* | 6/2013 | Romero | C23C 16/45565 438/795 |
| 2017/0218507 A1* | 8/2017 | Kim | C23C 16/0209 |

* cited by examiner

*Primary Examiner* — Rudy Zervigon
(74) *Attorney, Agent, or Firm* — McClure, Qualey & Rodack, LLP (57) ABSTRACT

A deposition device structure is provided. The deposition device structure includes a heater in a chamber. The deposition device structure also includes a shower head over the heater. The shower head includes holes extending from a top surface of the shower head to a bottom surface of the shower head. The bottom surface of the shower head faces the heater. The bottom surface of the shower head has a first section and a second section. The second section of the bottom surface is rougher than the first section of the bottom surface.

20 Claims, 5 Drawing Sheets

DEPOSITION DEVICE STRUCTURE

CROSS REFERENCE TO RELATED APPLICATIONS

This Application claims the benefit of U.S. Provisional Application No. 62/537,990, filed on Jul. 28, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

During the manufacturing of semiconductor devices, various processing steps are used to fabricate integrated circuits on a semiconductor wafer. Generally, the fabrication processes include deposition processes for forming various material layers over the semiconductor wafer. Since feature sizes continue to decrease, fabrication processes including the deposition processes continue to become more difficult to perform. Therefore, it is a challenge to deposit a material layer with a uniform thickness.

Although numerous improvements to the profile uniformity have been developed, they have not been entirely satisfactory in all respects. Consequently, it would be desirable to provide a solution to further improve the uniformity of a material layer that is formed using a deposition process.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure is related to a deposition device structure that is capable of achieving uniform deposition. Some embodiments of the disclosure are described. Additional features can be added to the deposition device structure. Some of the features described below can be replaced for different embodiments. Although some embodiments are discussed with features in a particular arrangement, these features may have another arrangement.

Figure 1:
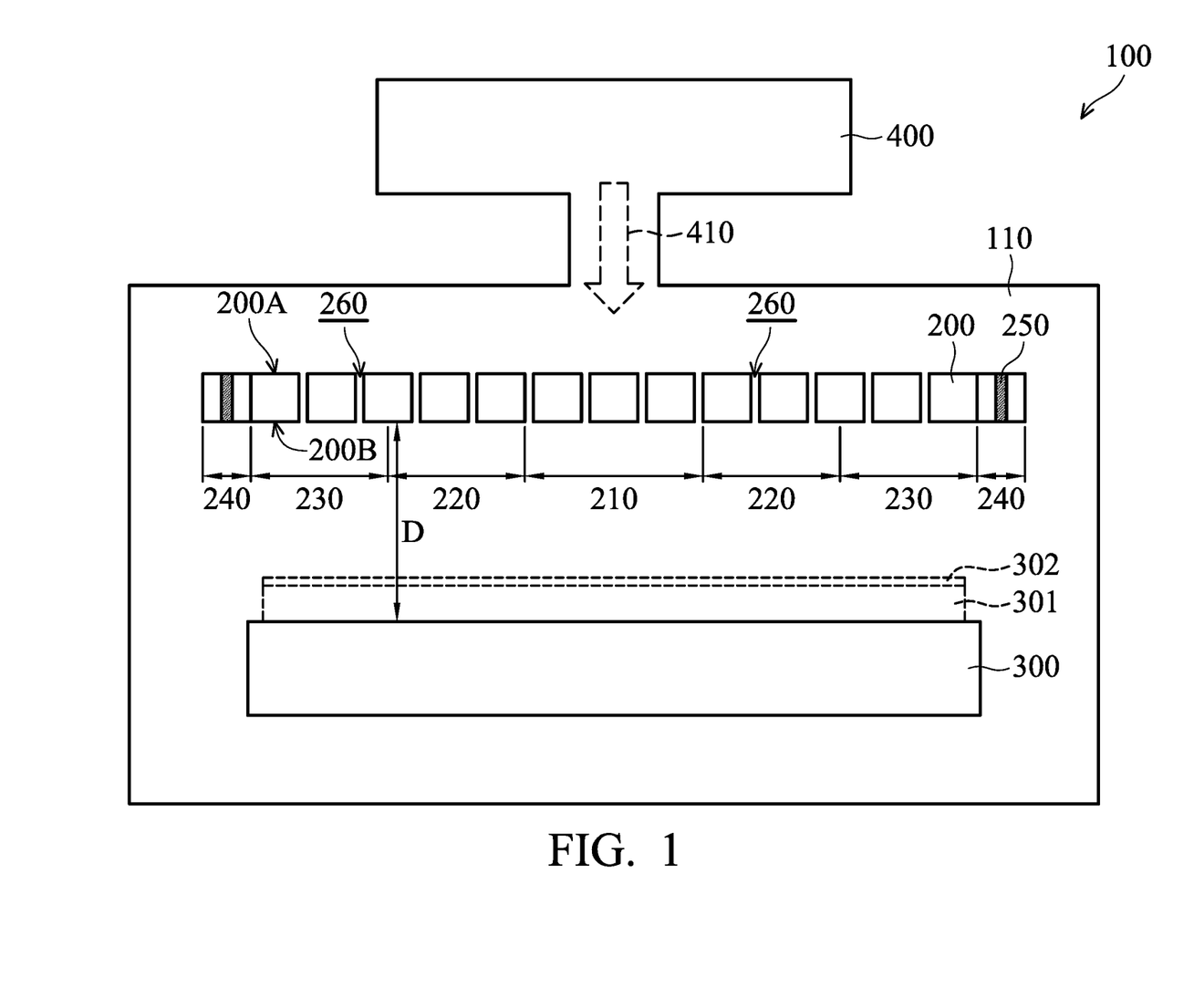
FIG. 1 is a cross-sectional view of a deposition device structure, in accordance with some embodiments.

FIG. 1 is a cross-sectional view of a deposition device structure, in accordance with some embodiments. A deposition device structure 100 is shown in FIG. 1. The deposition device structure 100 is used to perform a chemical vapor deposition (CVD) process or another applicable deposition process. As shown in FIG. 1, the deposition device structure 100 includes a shower head 200 in a chamber 110, a heater 300 in the chamber 110, and a gas supply assembly 400 connected to the chamber 110, in accordance with some embodiments. For the purpose of simplicity and clarity, other elements of the deposition device structure 100 are not shown in FIG. 1. Examples of other elements of the deposition device structure 100 may include a transfer assembly including robot arms, a cleaning assembly, a vacuum pump, etc.

A substrate will be transferred into the chamber 110 by a robot arm (not shown) and placed over the heater 300 to perform a deposition process. In some embodiments, the temperature in the chamber 110 during the deposition process is in a range from about 200° C. to about 500° C. In some embodiments, the pressure in the chamber 110 during the deposition process is in a range from about 2 torr to about 650 torr.

A semiconductor wafer 301 is shown in FIG. 1 as an example of the substrate. The heater 300 is configured to provide the semiconductor wafer 301 with thermal energy during the deposition process so that a material layer 302 will be deposited on the semiconductor wafer 301. Examples of the material layer 302 include a metal layer (such as a metal gate layer), a dielectric layer and a semiconductor layer. The semiconductor wafer 301 and the material layer 302 are illustrated as dashed lines for a better understanding of the configuration of the deposition device structure 100.

The gas supply assembly 400 is configured to provide a reactant gas (or a precursor gas) 410 as a source for depositing the material layer 302 during a deposition process. The reactant gas 410 will be reacted with the heated surface of the semiconductor wafer 301. As a result, the product of the reaction is deposited as the material layer 302 on the semiconductor wafer 301. The reactant gas 410 is illustrated as dashed lines for a better understanding of the configuration of the deposition device structure 100.

The shower head 200 is a gas distribution assembly that is positioned between the gas supply assembly 400 and the heater 300. The shower head 200 may be referred to as a face plate. The shower head 200 is configured to introduce and distribute the reactant gas 410 from the gas supply assembly 400 onto the semiconductor wafer 301 during a deposition process.

More specifically, as shown in FIG. 1, the shower head 200 has a top surface 200A and a bottom surface 200B. The top surface 200A faces the gas supply assembly 400. The bottom surface 200B faces the heater 300. In some embodiments, the shower head 200 includes multiple holes (or apertures) 260, which will be described in more detail later. The holes 260 extend from the top surface 200A to the bottom surface 200B. As a result, each of the holes 260 penetrates through the shower head 200. The reactant gas 410 will flow from the gas supply assembly 400 through the holes 260 to the semiconductor wafer 301 during the deposition process. For simplicity, the top surface 200A and the bottom surface 200B shown in FIG. 1 are flat surfaces, but embodiments of the disclosure are not limited thereto.

In some embodiments, the shower head 200 has an interior region and a peripheral region 240 that adjoins and surrounds the interior region. The interior region of the shower head 200 is divided into multiple sections (or zones), in accordance with some embodiments. Sections 210, 220 and 230, which will be described in more detail later, are shown in FIG. 1 as an example. The holes 260 penetrate through the shower head 200 in the interior region including the sections 210, 220 and 230. Multiple screws 250 penetrate through the shower head 200 in the peripheral region 240. The screws 250 are used to affix or mount the shower head 200 in the chamber 110. The screws 250 may be replaced with other suitable fasteners.

In some embodiments, the shower head 200 includes or is made of a metal-containing material, such as aluminum (Al), Al alloy, or another suitable material. In some embodiments, the diameter of the interior region of the shower head 200, which includes the sections 210, 220 and 230, is in a range from about 150 mm to about 490 mm. In some embodiments, the thickness of the shower head 200 is in a range from about 5 mm to about 40 mm. Embodiments of the disclosure can be applied to a shower head made of any suitable material and with any suitable geometry and dimension. In some embodiments, the distance D between the shower head 200 and the heater 300 is in a range from about 100 mils to about 700 mils.

Figure 2:
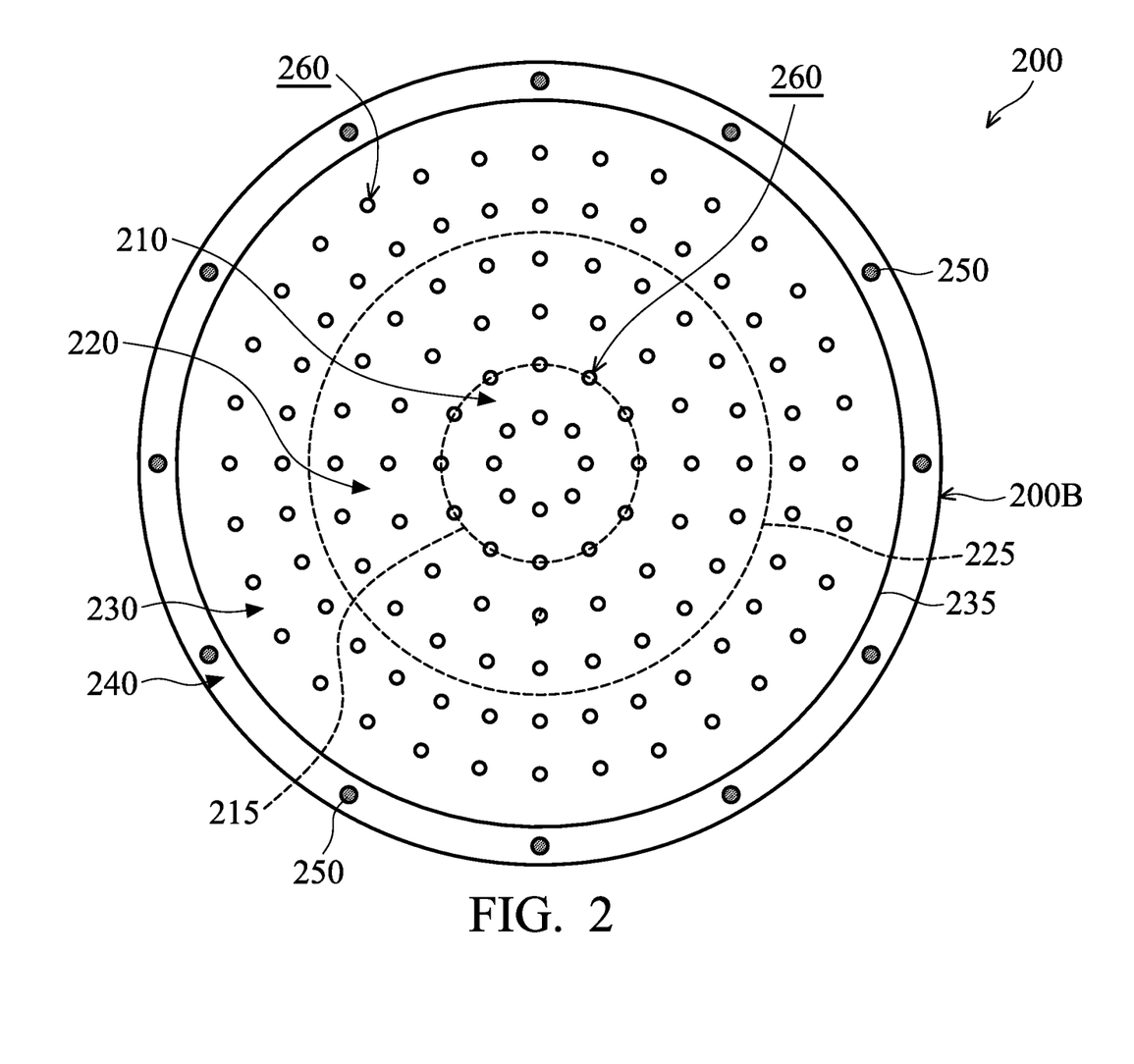
FIG. 2 is a top view of a shower head, in accordance with some embodiments.

FIG. 2 is a top view of a shower head 200, in accordance with some embodiments. In some embodiments, FIG. 2 shows the bottom surface 200B of the shower head 200 shown in FIG. 1. As mentioned above, the shower head 200 includes multiple holes 260 in the interior region including the sections 210, 220 and 230, as shown in FIG. 2 in accordance with some embodiments. The holes 260 are substantially uniformly distributed on the bottom surface 200B of the shower head 200. For example, the holes 260 are arranged in concentric rings that are spaced apart from a center point at various distances. The concentric rings have substantially the same interval or pitch between two adjacent concentric rings.

However, embodiments of the disclosure are not limited thereto. In some other embodiments, the holes 260 are arranged in concentric rings that have different intervals between two adjacent concentric rings. In some other embodiments, the holes 260 are non-uniformly or disorderly arranged on the bottom surface 200B of the shower head 200. For example, the holes 260 are not arranged in rings or arrays. Some of the holes 260 may be concentrated at the center and/or the edge of the bottom surface 200B of the shower head 200.

In some embodiments, the diameter of the holes 260 is in a range from about 0.1 mm to about 10 mm. The holes 260 may have the same size or different sizes. Although FIG. 2 shows that the top-view profile of the holes 260 is relatively rounded or circular, embodiments of the disclosure are not limited thereto. In some other embodiments, the holes 260 are rectangular, square, or another shape. The holes 260 may have the same shape or different shapes.

The number, dimension, shape and position of the holes 260 may depend on the desired amount of the reactant gas 410. For example, if more reactant gas 410 at the edge of the shower head 200 is desired, more or larger holes 260 are configured at the edge of the shower head 200. In contrast, if more reactant gas 410 at the center of the shower head 200 is desired, more or larger holes 260 are configured at the center of the shower head 200.

As shown in FIGS. 1 and 2, the bottom surface 200B of the shower head 200 is divided into multiple sections in the interior region, in accordance with some embodiments. A section 210, a section 220 and a section 230 are shown in FIG. 2 as an example, but embodiments of the disclosure are not limited thereto. The section 210 has a boundary 215, the section 220 has a boundary 225, and the section 230 has a boundary 235. The boundaries 215, 225 and 235 are illustrated as dashed lines in figures to show surface roughness profile/distribution of the bottom surface 200B of the shower head 200. The boundaries 215, 225 and 235 may be seen from a microscopic view and/or a macroscopic view. However, embodiments of the disclosure are not limited thereto. The boundaries 215, 225 and 235 may not be real lines in the deposition device structure 100 and therefore may not be visible from a microscopic view and/or a macroscopic view.

As shown in FIG. 2, the peripheral region 240 of the shower head 200 surrounds the section 210, the section 220 and the section 230. In some embodiments, one or more of the holes 260 overlap two of the section 210, the section 220 and the section 230. For example, one of the holes 260 overlaps the section 210 and the section 220, as shown in FIG. 2.

In some embodiments, the section 210 is a relatively rounded or circular. The section 220 and the section 230 are concentric rings that are spaced apart from the section 210 at different distances. In other words, the section 210 is surrounded by the section 220 and the section 230. The section 220 is surrounded by the section 230. The section 220 is sandwiched between the section 210 and the section 230.

In accordance with some embodiments, the bottom surface 200B of the shower head 200 has different roughness (or surface roughness) from the top surface 200A of the shower head 200. For example, the bottom surface 200B of the shower head 200 is rougher than the top surface 200A of the shower head 200. In accordance with some embodiments, the bottom surface 200B of the shower head 200 in the interior region has different roughness from the bottom surface 200B of the shower head 200 in the peripheral region 240. For example, the bottom surface 200B in the interior region is rougher than the bottom surface 200B in the peripheral region 240.

More specifically, the section 210, the section 220 and the section 230 of the bottom surface 200B in the interior region have different roughness, in accordance with some embodiments. In other words, the bottom surface 200B of the shower head 200 has a non-uniform roughness. The bottom surface 200B of the shower head 200 may be referred to as a microscopic uneven surface. In contrast, the top surface 200A of the shower head 200 has a substantially uniform roughness. The top surface 200A of the shower head 200 may be referred to as a microscopic even surface.

In some embodiments, each of the sections 210, 220 and 230 is rougher than the top surface 200A of the shower head 200. Many variations and/or modifications can be made to embodiments of the present disclosure. In some other embodiments, one of the sections 210, 220 and 230 has substantially the same roughness as the top surface 200A of the shower head 200 while other of the sections 210, 220 and 230 are rougher than the top surface 200A of the shower head 200.

In some embodiments, each of the sections 210, 220 and 230 is rougher than the peripheral region 240. Many variations and/or modifications can be made to embodiments of the present disclosure. In some other embodiments, one of the sections 210, 220 and 230 has substantially the same roughness as the peripheral region 240 while other of the sections 210, 220 and 230 are rougher than the peripheral region 240.

In some embodiments, the roughness of the bottom surface 200B of the shower head 200 in the interior region gradually increases from the center of the bottom surface 200B towards the peripheral region 240. For example, the section 210 may be smoother than the section 220 and the section 230. The section 220 may be smoother than the section 230. Alternatively, the roughness of the bottom surface 200B of the shower head 200 gradually reduces from the center of the bottom surface 200B to the edge of the bottom surface 200B. For example, the section 210 may be rougher than the section 220 and the section 230. The section 220 may be rougher than the section 230, and the section 230 may be rougher than the peripheral region 240.

Many variations and/or modifications can be made to embodiments of the present disclosure. In some other embodiments, the roughness of the bottom surface 200B of the shower head 200 does not gradually vary. For example, the section 220 between the section 210 and the section 230 may be rougher than the section 210 and the section 230.

In some embodiments, the bottom surface 200B of the shower head 200 in the interior region including the sections 210, 220 and 230 has a roughness that is in a range from about 0.05 μm to about 15 μm. In some embodiments, the bottom surface 200B of the shower head 200 in the peripheral region 240 has a roughness that is in a range from about 0.05 μm to about 15 μm.

The roughness (or surface roughness, Rz) is measured as the difference between highest and lowest surface features in the longitudinal direction within a predetermined area. Alternatively, the roughness is measured as the difference between the average of multiple high points and the average of multiple low points on a straight line of a predetermined length. The roughness can be measured by a contact-type surface roughness/profile measuring instrument or a non-contact surface roughness/profile measuring instrument. For example, the contact-type surface roughness/profile measuring instrument may be an Atomic Force Microscope (AFM) or another suitable measuring instrument. The non-contact surface roughness/profile measuring instrument may be a white light interferometer, a 3D laser scanning microscope or another suitable optical measuring instrument.

In some embodiments, the sections 210, 220 and 230 are machined to each have a different roughness. As a result, the sections 210, 220 and 230 individually become shiny and smooth or rough and matte. For example, there may be cutting traces (or notches) on the section 210, the section 220 or the section 230. The cutting traces may be microscopic and may not be visible from a macroscopic view. The cutting traces may be observed using an optical or electron microscope such as an AFM or another suitable microscope. However, embodiments of the disclosure are not limited thereto. The cutting traces may not be observed or the sections 210, 220 and 230 may not include cutting traces.

In accordance with some embodiments, the section 210 of the shower head 200 has a low roughness so that the section 210 of the shower head 200 has a high emissivity. The term of "emissivity" essentially means the relative ability of a material's surface to emit energy as radiation. It is expressed as the ratio of the emissivity of the material to the radiation emitted by a black body (an idealized physical body that absorbs all incident electromagnetic radiation) at the same temperature. This means that a black body may have an emissivity value of 1. Another object, which is also referred to as a grey body, may have an emissivity value of less than 1.

During a deposition process, the heater 300 provides the semiconductor wafer 301 over the heater 300 with thermal energy. The shower head 200 over the semiconductor wafer 301 also absorb thermal energy from the heater 300. Since the section 210 of the shower head 200 has a high emissivity, the section 210 of the shower head 200 emits more radiation towards the semiconductor wafer 301 during the deposition process. As a result, more thermal energy will be provided to the center of the semiconductor wafer 301, which overlaps the section 210 of the shower head 200. The semiconductor wafer 301 absorbs thermal energy from both the heater 300 and the shower head 200. The more thermal energy the semiconductor wafer 301 absorbs, the greater thickness the deposited material layer 302 has. In other words, the total amount of thermal energy absorbed by the semiconductor wafer 301 (or the temperature profile of the semiconductor wafer 301) changes as the emissivity of the shower head 200 changes. The thickness uniformity of the deposited material layer 302 may depend on the temperature profile/distribution of the semiconductor wafer 301. Accordingly, the thickness uniformity of the deposited material layer 302 is affected by the roughness of different sections of the shower head 200.

In accordance with some embodiments, the bottom surface 200B of the shower head 200 is divided into multiple sections 210, 220 and 230 with different roughness so as to control or modulate the thermal energy absorbed by the semiconductor wafer 301 in different regions. As a result, the thickness of the material layer 302 deposited on the semiconductor wafer 301 in different regions becomes adjustable.

For example, the section 210 of the shower head 200 has a lower roughness and a higher emissivity than the section 220 of the shower head 200. A portion of the material layer 302, which is deposited on the semiconductor wafer 301 in a region aligned with the section 210 of the shower head 200, has an increased thickness. Another portion of the material layer 302, which is deposited on the semiconductor wafer 301 in another region aligned with the section 220 of the shower head 200, has a lowered thickness. Therefore, the difference in thickness between different portions of the material layer 302, which may be induced by process variations, can be compensated for or balanced. The process variations may include difference in thermal conduction or convection, flow amount of reactant gas, distribution of reactant gas, or another factor.

The roughness of the sections 210, 220 and 230 of the shower head 200 can be fine-tuned to modify the thickness uniformity of the deposited material layer 302 on the semiconductor wafer 301. The number, dimension, shape and position of various sections of the bottom surface 200B of the shower head 200 can also be fine-tuned. Accordingly, the deposition device structure 100 shown in FIG. 1 enables more flexibility in a deposition process to meet any requirements.

More specifically, the roughness of the sections 210, 220 and 230 of the shower head 200 can be fine-tuned to ensure that the deposited material layer 302 has substantially the same thickness on the semiconductor wafer 301 in different regions. Accordingly, the deposited material layer 302 has a better uniformity.

Figure 3:
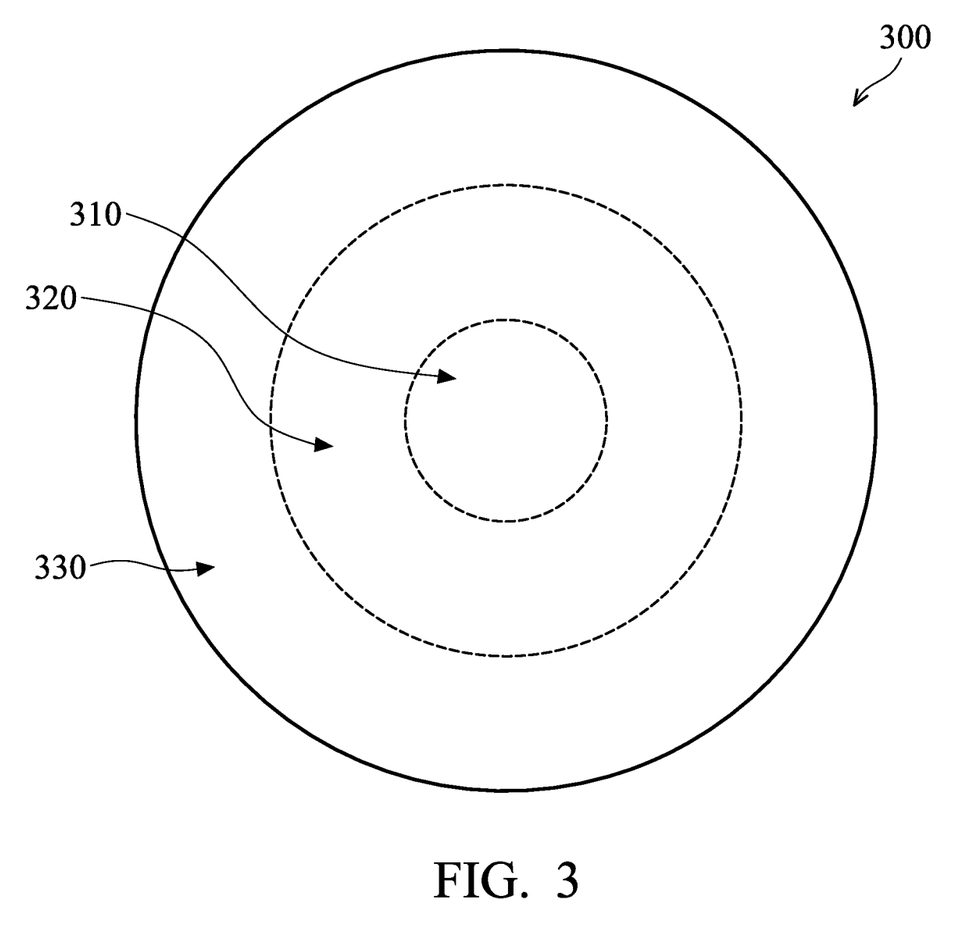
FIG. 3 is a top view of a heater, in accordance with some embodiments.

FIG. 3 is a top view of a heater, in accordance with some embodiments. In some embodiments, FIG. 3 shows a top view of the heater 300 shown in FIG. 1. In some embodiments, the heater 300 has various temperature regions so that the heater 300 is capable of modifying temperatures in different regions. A temperature region 310, a temperature region 320 and a temperature region 330 are shown in FIG. 3 as an example, but embodiments of the disclosure are not limited thereto. In some embodiments, the temperature region 310 is a relatively rounded or circular. The temperature region 320 and the temperature region 330 are concentric rings that are spaced apart from the temperature region 310 at different distances. In other words, the temperature region 310 is surrounded by the temperature region 320 and the temperature region 330. The temperature region 320 is surrounded by the temperature region 330. The temperature region 320 is sandwiched between the temperature region 310 and the temperature region 330.

In some embodiments, the temperature region 310 of the heater 300 is aligned with or overlaps the section 210 of the shower head 200. The temperature regions 320 and 330 of the heater 300 are aligned with or overlap the sections 220 and 230 of the shower head 200, respectively. In other words, the heater 300 is divided into the temperature regions 310, 320 and 330 corresponding to the sections 210, 220 and 230. In some embodiments, the temperature region 320 does not overlap the sections 210 and 230.

For example, in some embodiments, the section 210 of the shower head 200 has a lower roughness and a higher emissivity than the section 220 of the shower head 200. In these embodiments, the temperature region 310 of the heater 300 can be designed to have a higher temperature and provide more thermal energy than the temperature region 320 of the heater 300 during a deposition process. As a result, the section 210 of the shower head 200 emits much more thermal energy towards the semiconductor wafer 301 over the heater 300 during the deposition process. With the section 210 having a higher emissivity and the temperature region 310 having a higher temperature, the difference in thickness between different portions of the material layer 302 can be reduced even further.

Many variations and/or modifications can be made to embodiments of the present disclosure. In some other embodiments, the temperature regions 310, 320 and 330 of the heater 300 have substantially the same temperature during a deposition process. In some other embodiments, the heater 300 does not have multiple temperature regions and has substantially the same temperature during a deposition process. In these embodiments, the difference in thickness between different portions of the material layer 302 can be compensated due to the sections 210, 220 and 230 of the shower head 200 that have different roughness. Accordingly, the deposited material layer 302 still has an improved uniformity.

Figure 4:
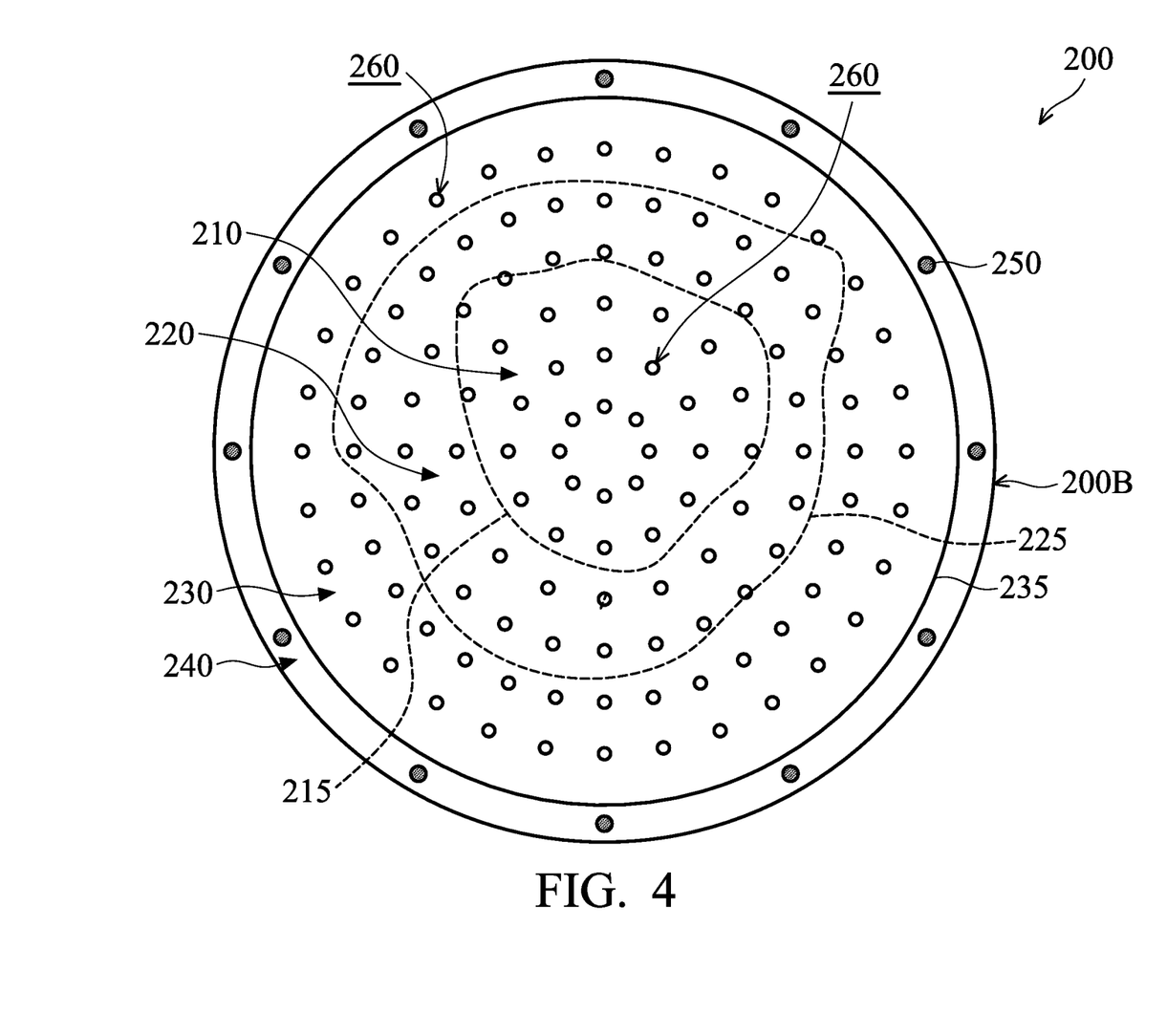
FIG. 4 is a top view of a shower head, in accordance with some embodiments.
Figure 5:
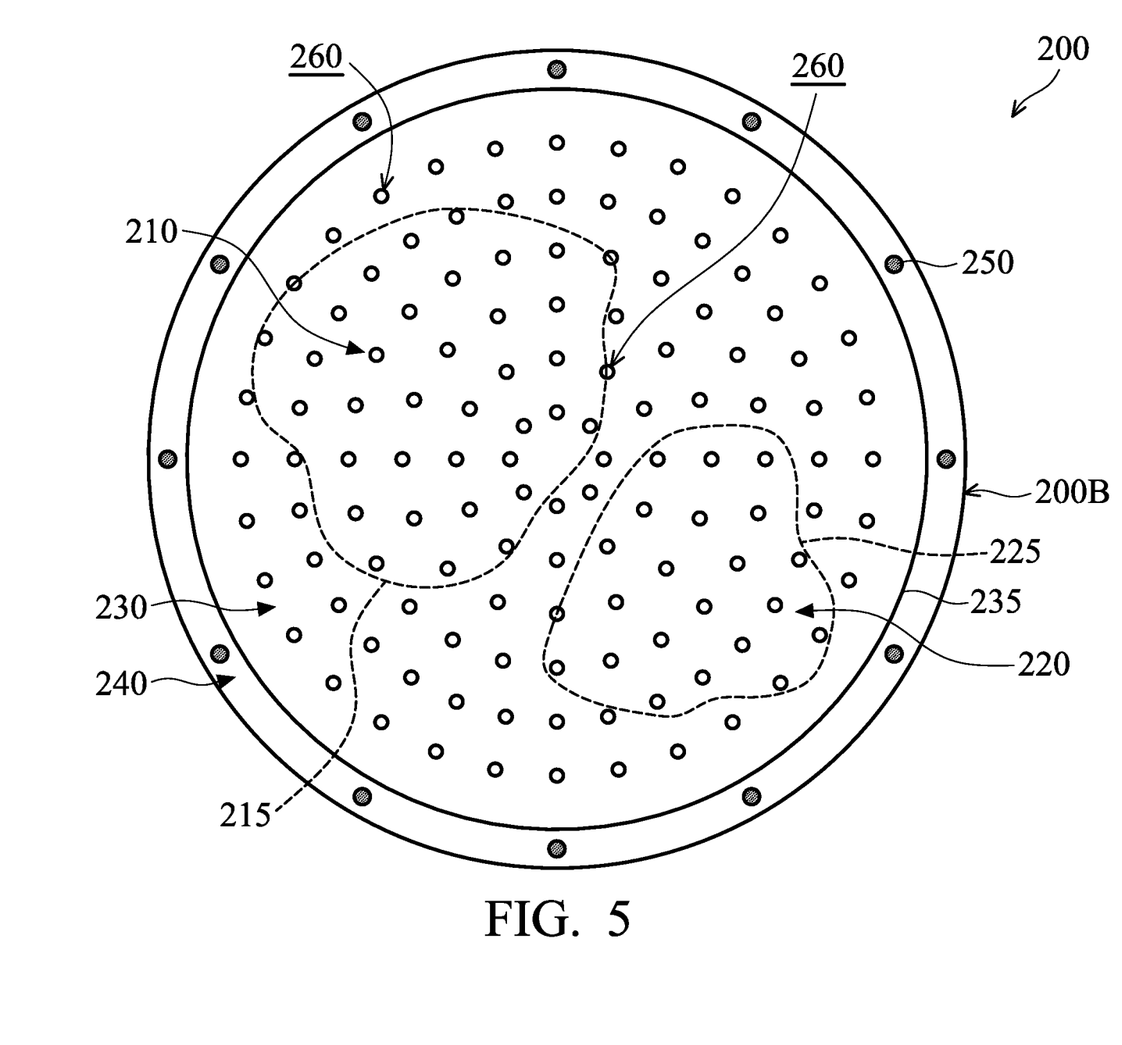
FIG. 5 is a top view of a shower head, in accordance with some embodiments.

Although FIG. 2 shows that the shower head 200 has a substantially symmetrical roughness distribution, embodiments of the disclosure are not limited thereto. In some other embodiments, the shower head 200 has an asymmetrical roughness distribution to meet other requirements. FIGS. 4 and 5 are top views of a shower head 200, in accordance with some embodiments. The arrangements and/or materials of the shower head 200 shown in FIGS. 4 and 5 are the same as or similar to those of the shower head 200 shown in FIGS. 1 and 2, as illustrated in the aforementioned embodiments, and therefore are not repeated.

As shown in FIG. 4, similar to the embodiments illustrated in FIG. 2, the peripheral region 240 of the shower head 200 surrounds the section 210, the section 220 and the section 230. The section 220 is sandwiched between the section 210 and the section 230. In some embodiments, the boundary 215 between the section 210 and the section 220 is irregular and different from the boundary 235 between the section 230 and the peripheral region 240, which is relatively round or circular. The boundary 225 between the section 220 and the section 230 is irregular and different from the relatively round boundary 235. In some embodiments, the irregular boundary 215 is different from the irregular boundary 225.

As shown in FIG. 5, similar to the embodiments illustrated in FIG. 2, the peripheral region 240 of the shower head 200 surrounds the section 210, the section 220 and the section 230. The section 210 and the section 220 are surrounded by the section 230 but the section 210 and the section 220 are separated from each other. In other words, the section 230 has a portion sandwiched between the section 210 and the section 230. In some embodiments, the section 210 has a greater area than the section 220. However, in some other embodiments, the section 210 and the section 220 have substantially the same area.

As shown in FIG. 5, similar to the embodiments illustrated in FIG. 4, the boundary 215 of the section 210 is irregular, and the boundary 225 of the section 220 is irregular. However, in some other embodiments, one or both of the boundary 225 and the boundary 215 have a regular shape, such as a circle, a rectangle or a square. In some embodiments, the boundary 225 has a different shape than the boundary 215. However, in some other embodiments, the boundary 225 and the boundary 215 have substantially the same shape.

It should be noted that the roughness distribution or pattern shown in FIGS. 2, 4 and 5 is not a limitation to the disclosure. The roughness of the bottom surface 200B of the shower head 200 may be determined according to a material layer deposited using a deposition device. For example, in some cases, this deposited material layer is thicker at the left side than the right side. Accordingly, the left side of the bottom surface 200B of the shower head 200 is designed to be rougher than the right side of the bottom surface 200B of the shower head 200. As a result, the material layer 302, which is deposited using the modified deposition device structure 100, becomes substantially the same thickness at the left and right sides.

Some embodiments of the disclosure may be applied to a deposition process for forming a metal gate layer, such as a tungsten (W) layer, so as to achieve a better gate height. Metal residue, which may be induced by poor uniformity of the metal gate layer after performing an etching back process over the metal gate layer, is mitigated or eliminated. Therefore, the deposition device structure in the aforementioned embodiments is capable of achieving uniform deposition. The semiconductor device structure formed using the deposition device structure has better reliability and good device performance.

Embodiments of the disclosure are not limited and may be applied to fabrication processes for any suitable technology generation. Various technology generations include a 10 nm node, a 7 nm node, or another suitable node. Furthermore, embodiments of the disclosure can be applied to a semiconductor device with planar FETs and/or FinFETs.

Embodiments of the disclosure provide a deposition device structure that is capable of achieving uniform deposition. The deposition device structure includes a shower head over a heater. The shower head has a surface facing the heater. The surface of the shower head has a non-uniform roughness. For example, a first section of the surface has a lower roughness than a second section of the surface. The first section has a higher emissivity than the second section. As a result, the first section emits more radiation towards a substrate over the heater during a deposition process than the second section. More thermal energy will be provided to a portion of the substrate, which overlaps the first section of the shower head.

The more thermal energy the substrate absorbs, the greater thickness a material layer deposited on the substrate during the deposition process has. Accordingly, the thickness uniformity of the deposited material layer is adjustable by modifying the roughness of different sections of the shower head. The difference in thickness between various portions of the deposited material layer, which may be induced by process variations, can be compensated for or balanced. Therefore, embodiments of the disclosure provide a deposition device structure that enables more flexibility in a deposition process to meet any requirements. More specifically, the roughness of various sections of the shower head can be fine-tuned to ensure that the deposited material layer has substantially the same thickness and a better uniformity.

In accordance with some embodiments, a deposition device structure is provided. The deposition device structure includes a heater in a chamber. The deposition device structure also includes a shower head over the heater. The shower head includes holes extending from the top surface of the shower head to the bottom surface of the shower head. The bottom surface of the shower head faces the heater. The bottom surface of the shower head has a first section and a second section. The second section of the bottom surface is rougher than the first section of the bottom surface.

In accordance with some embodiments, a deposition device structure is provided. The deposition device structure includes a heater in a chamber. The deposition device structure also includes a gas supply assembly connected to the chamber. The deposition device structure further includes a shower head between the gas supply assembly and the heater. The shower head has a first surface facing the heater. The shower head includes holes extending from the first surface to penetrate through the shower head. The first surface of the shower head has a first section, a second section and a third section. The first emissivity of the first section is different from the second emissivity of the second section and the third emissivity of the third section.

In accordance with some embodiments, a chemical vapor deposition device structure is provided. The chemical vapor deposition device structure includes a shower head over a heater. The shower head includes holes extending from the top surface of the shower head to the bottom surface of the shower head. The bottom surface of the shower head faces the heater. The top surface of the shower head has a substantially uniform roughness. The bottom surface of the shower head has a non-uniform roughness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A deposition device structure, comprising:
   a heater in a chamber; and
   a shower head over the heater, wherein the shower head comprises holes extending from a top surface of the shower head to a bottom surface of the shower head, wherein the bottom surface of the shower head faces the heater, and the bottom surface of the shower head has a first section and a second section, wherein the second section of the bottom surface is rougher than the first section of the bottom surface and the top surface of the shower head.

2. The deposition device structure as claimed in claim 1, wherein the first section and the second section of the bottom surface of the shower head are rougher than the top surface of the shower head.

3. The deposition device structure as claimed in claim 1, wherein a first roughness of the first section of the bottom surface of the shower head is less than a second roughness of the second section of the bottom surface of the shower head, and wherein the first roughness is substantially equal to a third roughness of the top surface of the shower head.

4. The deposition device structure as claimed in claim 1, wherein the first section and the second section of the bottom surface of the shower head are concentric rings.

5. The deposition device structure as claimed in claim 1, wherein the first section and the second section of the bottom surface of the shower head have an irregular boundary.

6. The deposition device structure as claimed in claim 1, wherein the heater has a first temperature region substantially aligned with the first section of the bottom surface, and wherein the heater further has a second temperature region substantially aligned with the second section of the bottom surface without overlapping the first section of the bottom surface.

7. A deposition device structure, comprising:
   a heater in a chamber;
   a gas supply assembly connected to the chamber; and
   a shower head between the gas supply assembly and the heater, wherein the shower head has a first surface facing the heater, and the shower head comprises holes extending from the first surface to penetrate through the shower head, and wherein the heater has a first temperature region and a second temperature region, and the temperature of the first temperature region is higher than that of the second temperature region, wherein the first surface of the shower head has a first section, a second section and a third section, and wherein a first emissivity of the first section is higher than a second emissivity of the second section and different from a third emissivity of the third section, and wherein the first temperature region is substantially aligned with the first section, and the second temperature region is substantially aligned with the second section.

8. The deposition device structure as claimed in claim 7, wherein the shower head has a second surface facing the gas supply assembly, and wherein a fourth emissivity of the second surface is greater than the first emissivity, the second emissivity and the third emissivity.

9. The deposition device structure as claimed in claim 7, wherein one of the holes overlaps the first section and the second section of the first surface.

10. The deposition device structure as claimed in claim 7, wherein the first section of the first surface is substantially circular, and the second section and the third section of the first surface are rings.

11. The deposition device structure as claimed in claim 7, wherein the first section and the second section of the first surface have an irregular boundary, and the third section of the first surface surrounds the first section and the second section.

12. The deposition device structure as claimed in claim 7, wherein the heater has a third temperature region that overlaps the third section of the first surface, and wherein the second temperature region is sandwiched between the first temperature region and the third temperature region.

13. The deposition device structure as claimed in claim 7, wherein the first surface of the shower head has an interior region and a peripheral region surrounding the interior region, and the deposition device structure further comprises screws within the shower head in the peripheral region, wherein the first section, the second section and the third section are within the interior region, and wherein the first surface in the peripheral region has a fifth emissivity that is different from the first emissivity.

14. The deposition device structure as claimed in claim 13, wherein the shower head has a second surface facing the gas supply assembly, and a fourth emissivity of the second surface is substantially equal to the fifth emissivity in the peripheral region, and wherein the fourth emissivity is greater than the second emissivity and the third emissivity within the interior region.

15. A chemical vapor deposition device structure, comprising:

a shower head over a heater, wherein the shower head comprises holes extending from a top surface of the shower head to a bottom surface of the shower head, and the bottom surface of the shower head faces the heater, wherein the top surface of the shower head has a substantially uniform roughness, and the bottom surface of the shower head has a non-uniform roughness, and the roughness of the bottom surface of the shower head gradually varies from a center of the bottom surface to an edge of the bottom surface.

16. The chemical vapor deposition device structure as claimed in claim 15, wherein the shower head comprises a metal-containing material, and wherein a first emissivity of the bottom surface of the shower head is less than a second emissivity of the top surface of the shower head.

17. The chemical vapor deposition device structure as claimed in claim 16, wherein the bottom surface of the shower head has an interior region and a peripheral region surrounding the interior region, and the chemical vapor deposition device structure further comprises fasteners within the shower head in the peripheral region, and wherein the interior region is rougher than the peripheral region.

18. The chemical vapor deposition device structure as claimed in claim 17, wherein the interior region is divided into a first section and a second section, and the second section is rougher than the first section and the peripheral region.

19. The chemical vapor deposition device structure as claimed in claim 15, further comprising:

a gas supply assembly, wherein the top surface of the shower head faces the gas supply assembly, and wherein the bottom surface of the shower head is rougher than the top surface of the shower head.

20. The deposition device structure as claimed in claim 1, wherein the heater has a first temperature region and a second temperature region, and the temperature of the first temperature region is higher than that of the second temperature region, and wherein the first temperature region is substantially aligned with the first section, and the second temperature region is substantially aligned with the second section.

* * * * *